United States Patent [19]

Johnson et al.

[11] Patent Number: 5,691,865
[45] Date of Patent: Nov. 25, 1997

[54] MAGNETIC DEVICE AND METHOD FOR LOCALLY CONTROLLABLY ALTERING MAGNETIZATION DIRECTION

[75] Inventors: Mark T. Johnson; Friedrich J. A. Den Broeder; Jelto W. Smits, all of Eindhoven, Netherlands

[73] Assignee: U.S. Philips Corporation, New York, N.Y.

[21] Appl. No.: 767,461

[22] Filed: Dec. 16, 1996

Related U.S. Application Data

[63] Continuation of Ser. No. 389,853, Feb. 17, 1995, abandoned.

[30] Foreign Application Priority Data

Feb. 21, 1994 [EP] European Pat. Off. .......... 94200453

[51] Int. Cl.$^6$ ............................................. G11B 5/33
[52] U.S. Cl. ............................................. 360/113; 360/126
[58] Field of Search ....................... 360/113, 125, 360/126; 324/252; 338/32 R

[56] References Cited

U.S. PATENT DOCUMENTS

| | | | |
|---|---|---|---|
| 3,604,938 | 9/1971 | Kohashi et al. | 250/214 LA |
| 4,035,060 | 7/1977 | Tsunoda et al. | 349/152 |
| 4,466,004 | 8/1984 | Kobayashi et al. | 346/74.4 |
| 5,343,422 | 8/1994 | Kung et al. | 365/173 |
| 5,390,061 | 2/1995 | Nakatani et al. | 360/113 |
| 5,408,377 | 4/1995 | Gurney et al. | 360/113 |
| 5,432,373 | 7/1995 | Johnson | 257/421 |
| 5,440,233 | 8/1995 | Hodgson et al. | 324/252 |
| 5,474,833 | 12/1995 | Etienne et al. | 428/209 |
| 5,585,986 | 12/1996 | Parkin | 360/113 |
| 5,598,308 | 1/1997 | Dieny et al. | 360/113 |

OTHER PUBLICATIONS

"New Magnetic Anisotropy" by W.H. Meiklejohn & C.P. Bean, Phys. Rev. vol. 102, No. 5 (Mar. 7, 1956), pp. 1413–1414.

"Solid State Physics", by A.J. Dekker, Macmillan & Co., Ltd., London (1960), Chapter 14.

"New Magnetic Anisotropy" by W.H. Meiklejohn & C.P. Beam, Phys. Rev. vol. 105, No. 3 (Oct. 15, 1956), pp. 904–913.

"The Complete Handbook of Magnetic Recording", Copyright 1980 Pennsylvania by Tab Books, Inc., F. Jorgenson, Chapter 3.

"Physics of Semiconductor Devices", by S.M. Sze, 2nd Edition, John Wiley & Sons, New York (1981), Chapter 8.

Phys. Rev. Letter 57 (1986), P. Grunberg et al, pp. 2442–2445. (Nov. 10, 1986).

Phys. Rev. Letter 64 (1990), S.S. P. Parkin et al, pp. 2304–2307. (May 7, 1990).

*Primary Examiner*—Jefferson Evans
*Attorney, Agent, or Firm*—Steven R. Biren

[57] ABSTRACT

A device and method for controllably locally altering the magnetization direction in a body of magnetic material, whereby a layer of at least one of non-metallic material and a semi-metallic material is disposed on a surface of the body, on which layer is provided a body of magnetic material having a fixed magnetization direction, whereby both bodies of magnetic material are magnetically coupled across the interposed layer, the nature of this magnetic coupling being locally alterable by means of locally subjecting the layer to a controllable electric field.

16 Claims, 3 Drawing Sheets

1

MAGNETIC DEVICE AND METHOD FOR LOCALLY CONTROLLABLY ALTERING MAGNETIZATION DIRECTION

This is a continuation of application Ser. No. 08/389,853, filed Feb. 17, 1995, now abandoned.

BACKGROUND OF THE INVENTION

The invention relates to a method of locally controllably altering the magnetization direction in a body of magnetic material.

The invention also relates to a device making use of such a method, in particular a magnetic head.

The invention further relates to a method of controllably representing binary information in such a device.

A method as elucidated in the opening paragraph is well known from common elementary teachings, and involves the subjection of the magnetic body to an external magnetic field whose magnitude exceeds the body's coercive field $H_c$, thereby forcing the magnetization in the magnetic body to align itself parallel to the external field. An equally well-known variant of this method involves heating the body in the presence of an external magnetic field of magnitude less than $H_c$ (at ambient temperature), by virtue of which heating the coercivity of the material decreases, so that the magnetization direction in the body can nevertheless be forced into parallelism with the external field. Such external magnetic fields may be derived from a permanently magnetized material or from an electromagnet.

The principles hereabove elucidated are fundamental to many known methods of magnetically recording information. For example, the magnetic head in a common tape recorder is used to transform a varying electrical signal into a fluctuating magnetic field, which in turn alters the magnetization direction in small magnetic domains within the tape, thereby endowing it with magnetically patterned information. See, for example, "The complete handbook of magnetic recording", F. Jorgensen, TAB BOOKS Inc., Pennsylvania (1980), in particular Chapter 3. Alternatively, so-called magnetic-field-modulated magneto-optical recording methods employ a laser beam to locally heat a confined region of a magnetic disc, in which region the local magnetization direction is concurrently manipulated into one of two directions using a fluctuating external magnetic field generated by a coil, thereby achieving the storage of binary information. See, for example, U.S. Pat. No. 4,466,004.

A disadvantage of such known methods is that they require the application of a fluctuating external magnetic field. Magnetic fields are generally very difficult to localize, i.e. to confine in a well-defined manner to a limited region of specified spatial extent. As a result, highly localized manipulation of the magnetization in a magnetic body is difficult to achieve with external magnetic fields alone. For such a purpose, therefore, reliance must generally be made upon the assistant heating effect of a sharply focused laser beam, whereby, regardless of the spatial extent of the applied external magnetic field, only the magnetization in that region heated by the laser beam will allow itself to be directionally altered. However, satisfactory enaction of such a laser-assisted method is practically limited to magnetic materials having a relatively low Curie temperature, since the laser power otherwise required becomes incompatible with the electrical power provisions of many battery-operated devices. Furthermore, the effect of laser-assisted methods is practically limited to the surfaces of the laser-irradiated body.

A further drawback of the use of a fluctuating external magnetic field is that the means by which it is generated are intrinsically "macroscopic", which conflicts with continuing modern trends towards device miniaturization. In the case of non-superconducting coils, the magnitude of the required magnetic field dictates the minimum cross-sectional area and multiplicity of the coil windings, thereby placing a lower limit on the coil dimensions corresponding to a given field strength. For the fluctuating magnetic fields conventionally employed in modern recording apparatus, this limitation results in typical coil dimensions of the order of a millimeter. Reduction of coils to microscopic dimensions is possible, at considerable expense, but such mini-coils generate magnetic fields which are insufficiently strong for many intended practical applications. To somewhat enhance the magnetic field strength delivered by such mini-coils, a magnetic yoke may be incorporated as a core. Such a measure, however, involves considerable additional fabrication processing, and places additional demands on available space, contrary to miniaturisation demands. The resulting magnetic field remains insufficient for many practical applications.

SUMMARY OF THE INVENTION

It is an object of the invention to provide a method as stated in the opening paragraph, without reliance on an external fluctuating magnetic field. It is a further object of the invention that such a method should be easily compatible with modern trends towards miniaturization, portability and low power consumption. It is yet another object of the invention that such a method should achieve relatively rapid alteration of the magnetization direction in the magnetic body concerned. Still another object of the invention is that such alteration should be, if so desired, highly localizable.

These and other objects are achieved in a method of locally controllably altering the magnetization direction in a body of magnetic material, characterized in that a layer of non-metallic material is disposed on a surface of the body, on which layer is provided a body of magnetic material having a fixed magnetization direction, whereby both bodies of magnetic material may be magnetically coupled across the interposed non-metallic layer, the nature of this magnetic coupling being locally alterable by means of locally subjecting the layer of non-metallic material to a controllable electric field.

The terminology introduced hereabove is intended to have the following scope:

The term "magnetic body" should be widely interpreted as referring to such objects as, for example, individual thin films and layers, multilayer structures, thick films and layers, bulk plates or blocks of material, magnetic yokes, magnetic heads, etc., all of which at least partially comprise magnetic material, and all of which can demonstrate a non-zero net local magnetization direction. Such bodies may, where appropriate, be hollow or solid, flat or contoured, plain or structured, singular or composite, etc. The magnetic material itself may, for example, be ferromagnetic or ferrimagnetic, pure or alloyed, crystalline or amorphous. The magnetic bodies involved in the inventive method may, of course, be of mutually different composition;

The term "non-metallic" should not be interpreted as referring to exterior physical appearance, but applies instead to a particular class of electronic band structures, which will be elucidated in more detail herebelow. Non-metallic substances falling within the scope of the term as here employed include semiconductor materials, so-called semi-metallic materials and insulator materials;

The term "fixed" as hereabove employed is intended to have a relative meaning: the magnetization $M_1$ in a first magnetic body is "fixed" with respect to the magnetization $M_2$ in a second magnetic body if, under the sole influence of a variable external magnetic field of strength H, the value of H required to achieve the directional reversal of $M_1$ is higher than that required to achieve the directional reversal of $M_2$. An exemplary method of fixing the magnetization direction in a magnetic body is to exchange-bias it to another magnetic material (the general principles of exchange-biasing are discussed in articles by W. H. Meiklejohn and C. P. Bean in Phys. Rev. 102 (1956), pp 1413–1414 and Phys. Rev. 105 (1957), pp 904–913; a particular example of an exchange-biased system is NiFe/FeMn). Alternatively, if the coercive field of a first magnetic body exceeds that of a second magnetic body, then the magnetization of the first magnetic body may be regarded as being "fixed";

The "nature" of the magnetic coupling J refers essentially, though not exclusively, to its sign and/or strength. In the context of this definition, the following coupling examples may be considered as being of mutually different "nature":

Ferromagnetic coupling and anti-ferromagnetic coupling;
Weak coupling and strong coupling, regardless of sign;
Bilinear coupling (ferromagnetic or anti-ferromagnetic) and biquadratic coupling (90-degree coupling);
Absence and presence of coupling, irrespective of further classification of nature.

This list is given for purposes of clarification only, and is by no means exhaustive.

The insights on which the inventive method are based will now be elucidated.

It has been known for a number of years that two layers of ferromagnetic material can be magnetically coupled across an interposed layer of metallic material. See, for example, the article by P. Grünberg et al. in Phys. Rev. Lett. 57 (1986), pp 2442–2445. Depending on the thickness of the interposed layer, such coupling may demonstrate a ferromagnetic (F) or antiferromagnetic (AF) nature, as discussed by S. S. P. Parkin et al. in Phys. Rev. Lett. 64 (1990), pp 2304–2307.

With this background knowledge, the inventors have noted an important distinction between the electronic band structure of metals and non-metals. In metals, there is no energy gap between the valence band and the conduction band, and the Fermi level is populated by electrons which are capable of partaking in conduction and inducing magnetic coupling. In non-metals (such as semiconductors, semi-metals and insulators) however, the valence band is separated from the conduction band by an energy gap which straddles the Fermi level; as a result, there are essentially no conduction electron states at the Fermi level. Further information with regard to electronic band structure is given in the following publications:

A. J. Dekker, "Solid State Physics", Macmillan and Co. Ltd., London (1960), in particular Chapter 14.

S. M. Sze, "Physics of semiconductor devices", second edition, John Wiley and Sons, New York (1981), in particular Chapter 8.

On the basis of this insight, the inventors have realized that, if electrons having an energy approximately equal to the Fermi energy could be injected into a non-metal, then such a non-metal could be endowed with a certain degree of metallic character. Such an electronically modified non-metal could then be expected to demonstrate a degree of magnetic coupling, just as in the case of conventional metals.

The present invention achieves the above-described electronic injection by subjecting a non-metallic material to a controllable electric field, in particular by applying a controllable DC electrical voltage difference across it. If the size of the energy gap in the employed non-metal is relatively small, then satisfactory electronic injection can occur for a correspondingly small electrical voltage difference (e.g. in the range 0–6 V). This basic concept lies at the heart of the inventive method. For example:

Consider two ferromagnetic bodies which are sandwiched about an interposed layer of non-metallic material, but are not magnetically coupled across it. The net magnetizations in these two bodies will be essentially independent of one another;

If, however, the non-metallic material is given a partially metallic character, thereby invoking magnetic coupling across it, then the net magnetizations in the two bodies will adopt a well-defined mutual configuration (e.g. anti-parallel in the case of AF coupling). Since the magnetization direction in one of the ferromagnetic bodies is fixed, the adoption of such a definite configuration will, in general, require the magnetization direction in the other ferromagnetic body to alter its direction;

In an alternative scenario, the initial coupling across the non-metallic interlayer is weakly ferromagnetic, as a result of so-called "pinhole formation" between the ferromagnetic bodies. The inventive method may then be employed, for example, either to strengthen this existing coupling, or to otherwise change its nature.

The inventors have successfully achieved strong anti-ferromagnetic coupling across both semiconductors and semi-metals. For example:

A multilayer sample comprising 20×(3 nm Fe+1.4 nm Si) demonstrated a room-temperature saturation field of approximately 700 kA/m;

A multilayer sample comprising 20×(3 nm Fe+2 nm FeSi) demonstrated a room-temperature saturation field of approximately 600 kA/m.

In principle, insulator materials (such as Si oxides) can also be employed as non-metallic interlayers in the inventive method.

In general, it is desirable to ensure that the magnitude of the magnetic coupling across the non-metallic material is as large as possible. As evident from the above-cited article by Parkin et al., the magnitude of the magnetic coupling across a metallic interlayer is a function of the thickness of that interlayer, and generally increases as that thickness is decreased. Assuming that a similar dependence applies to a non-metallic interlayer as used in the inventive method, an optimum magnitude of the interlayer coupling will be obtained when the thickness of the non-metallic interlayer does not exceed 10 nm.

Although not fundamentally required according to the invention, the inventive method may also be enacted with the assistance of a static external magnetic field. Such a field may, for example, be employed to more efficiently manipulate the magnetization in one of the magnetic bodies after or during alteration of the coupling across the non-metallic interlayer.

The invention also relates to a device suitable for use in the inventive method. According to the invention, such a device is characterized in that it comprises at least two bodies of magnetic material which are magnetically coupled across an interposed layer of non-metallic material, one of the magnetic bodies having a fixed magnetization direction, the device further comprising means for at least locally subjecting the non-metallic material to a controllable electric field so as to controllably locally alter the nature of the said magnetic coupling.

In such a device, the required electric field may be provided by, for example, connecting the magnetic bodies to opposite poles of a controllable DC voltage source. If both magnetic bodies have a continuous interface with the non-metallic interlayer, then connection of the bodies across such a voltage source will cause an electric field to be applied across the entire extent of the intervening non-metallic material. If, however, at least one of the magnetic bodies is suitably structured into a multiplicity of electrically isolated potions (e.g. with the aid of a selective etching process), each of which portions has an interface with the non-metallic interlayer and each of which can separately be electrified, then a controllable electric field can be applied across the interlayer on a selective localized basis.

If the bodies of magnetic material in the inventive device are to demonstrate optimal electrical conductivity, so as to facilitate the efficient generation of an electrical field between them, then they should preferably comprise a non-oxidic metallic material, such as non-oxidic Fe. Another suitable material in this category is, for example, Co.

It is of course possible to embody at least one of the magnetic bodies in the inventive device as a magnetic multilayer structure. The term "magnetic multilayer" as here employed is intended to refer to any plurality of layers, at least one of which is magnetic. Well-known examples of magnetic multilayer systems are Co/Pt, Co/Pd, Co/Ni, Co/Cu and Fe/Cr, among many others.

A preferential embodiment of a device according to the preceding paragraph is characterized in that the multilayer structure demonstrates a spin-valve magneto-resistance effect. The electrical resistance of such a magneto-resistive multilayer is dependent on the relative orientation of the magnetizations in its constituent magnetic layers. If the magnetization direction in at least one such layer is altered using the inventive method, then the electrical resistance of the multilayer structure will change accordingly. In this way, resistance measurements in the multilayer can be used to deduce the nature of the magnetic coupling across the non-metallic interlayer, since it is the coupling which dictates the mutual magnetization configuration in the magnetic bodies at any given time.

The various materials in the inventive device, and in particular the non-metallic interlayer, can be provided by a variety of suitable techniques. These include, for example, sputter deposition, laser ablation deposition, physical and chemical vapor deposition and molecular beam epitaxy (MBE). The chosen deposition method can influence, for example, the strength of the coupling across the non-metallic interlayer. Particularly large coupling strengths are obtainable with MBE and sputter deposition.

In addition to the layer of non-metallic material, the inventive device may, of course, comprise additional (multi) layers of material. Such additional layers may, for example, be necessary to enact exchange biasing of (at least) one of the magnetic bodies to another magnetic material. Alternatively, such layers may fulfil specific device functions, and may include insulating layers, anti-corrosion layers, adhesion layers, patterned layers of electrically conducting tracts, etc.

It should be noted that the magnetic anisotropy of the magnetic bodies in the inventive method and device as hereabove described may display various directions with respect to the plane of the non-metallic interlayer. For example, the magnetization of at least one of the magnetic bodies may be substantially parallel or perpendicular to the interlayer.

The device according to the invention has many important applications. A particularly striking example is its employment as an ultrathin magnetic head for recording purposes. For example, such an embodiment can be envisaged as follows:

A conventional magnetic head essentially comprises an electrical coil which is wound around part of a split magnetic yoke. Electrical current fluctuations in the coil are translated into magnetic flux fluctuations in the yoke, particularly in the region of the split. A magnetic medium in proximity to this split can thus be subjected to a localized fluctuating magnetic field, which can locally alter the magnetization direction in the medium, thereby endowing it with magnetically patterned information;

In the inventive device, the magnetization direction in one of the magnetic bodies can be controllably altered by employing an electrical field to predictably change the nature of the magnetic coupling across the non-metallic interlayer. For example, if this coupling is altered between a ferromagnetic and anti-ferromagnetic nature, then, since the magnetization direction in one of the magnetic bodies is fixed, the magnetization direction in the other magnetic body can be controllably flipped back and forth. If the electrical field across the interlayer is modulated in accordance with certain binary data to be recorded, then a magnetic medium in proximity to this flipping magnetization can be endowed with that binary data.

If the magnetic bodies are embodied as thin films, then the inventive magnetic head can be very thin indeed, and certainly much smaller than a conventional magnetic head. Furthermore, such an inventive head is much easier to fabricate, since it does not involve a coil-winding procedure.

An important potential application of the device and method according to the present invention is in the "trimming" of a magnetic circuit. During operation, an undesirable magnetic domain structure can develop in magnetic circuits such as, for example, recording heads, magneto-resistive sensors and transformer yokes. Using the inventive method, however, the circuit's original magnetic domain structure may be at least locally restored. This may be achieved by interposing a non-metallic layer between (part of) the magnetic circuit and a reference magnetic body with a "fixed" magnetic domain pattern. If there is intrinsically little or no magnetic coupling across the non-metallic interlayer, then the magnetic circuit will not be influenced by the reference magnetic body. However, if stronger magnetic coupling is temporarily invoked across the interlayer (by subjecting it to an electric field, in accordance with the invention), then the domain pattern in the magnetic circuit can temporarily be "exposed" to, and reconfigured by, the fixed domain pattern in the magnetic reference body.

The invention further relates to an exemplary method of controllably representing binary information in the inventive device. In accordance with the invention, such a method is characterized in that a first binary symbol is represented by locally invoking ferromagnetic coupling across the non-metallic interlayer so as to locally induce substantially mutually parallel alignment of the magnetizations in the two magnetic bodies, whereas a second binary symbol is represented by locally invoking antiferromagnetic coupling across the non-metallic interlayer so as to locally induce substantially mutually anti-parallel alignment of the magnetizations in the two magnetic bodies.

In such a method, a spin-valve magneto-resistive multilayer structure (for example) may be employed as hereabove elucidated to monitor the mutual orientation of the magnetizations in the two magnetic bodies at any given time i.e. to determine which binary symbol "1" or "0") is therein represented. This same monitoring can also be achieved via, for example, magnetometry or magneto-optical Kerr measurements.

Using such a method in conjunction with a device according to the invention, it is possible to make magnetic memory devices with very short access times and high storage densities. In a particular embodiment of the inventive device lending itself to this application, two layers of magnetic material are ferromagnetically coupled across an interposed non-metallic layer (as a result of pinhole formation, for example). One of the magnetic layers is continuous and has a fixed magnetization direction, whereas the other is divided into a number of isolated electrode segments (using, for example, a selective etching technique). These isolated electrode segments are individually connected to controllable DC voltage sources, so that they can be individually electrified. The continuous magnetic layer, on the other hand, is kept at a fixed electrical potential. By suitably electrifying a given electrode segment, an electric field will be locally applied across the piece of intervening non-metallic material between that particular electrode segment and a directly opposed portion of the continuous magnetic layer, thereby inducing AF coupling across that piece of intervening material. As a result, the magnetization direction in the said electrode segment will reverse its direction, and this can be verified using spin-valve magneto-resistance measurements. A device of this type can be used to make a magnetic random-access memory (MRAM).

BRIEF DESCRIPTION OF THE DRAWING

The invention and its attendant advantages will be further elucidated with the aid of exemplary embodiments and the accompanying schematic drawing, not of uniform scale, wherein.

DESCRIPTION OF THE PREFERRED EMBODIMENTS

Figure 1:
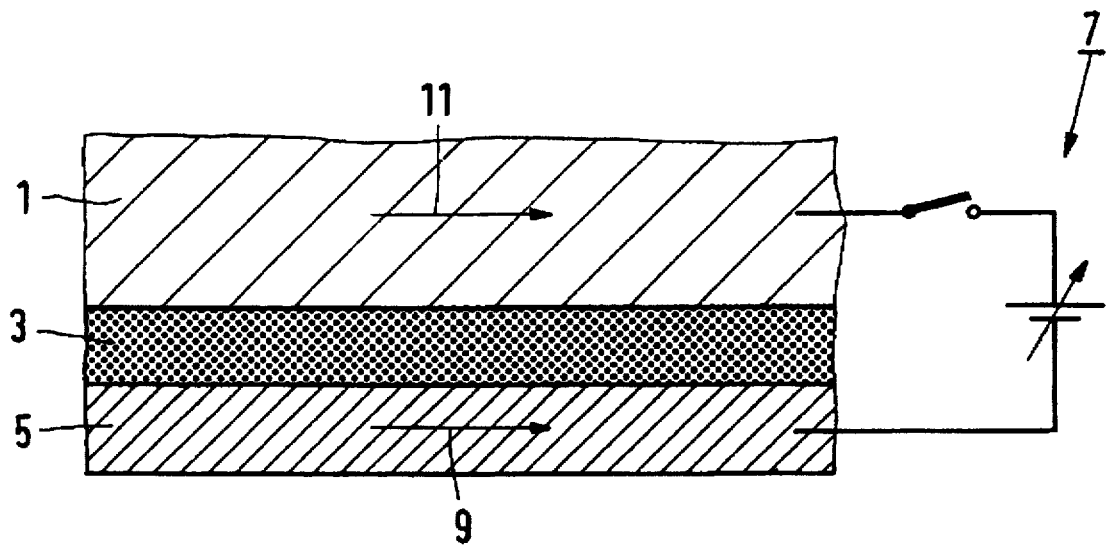
FIG. 1 renders a cross-sectional view of part of a device according to the invention.
Figure 2:
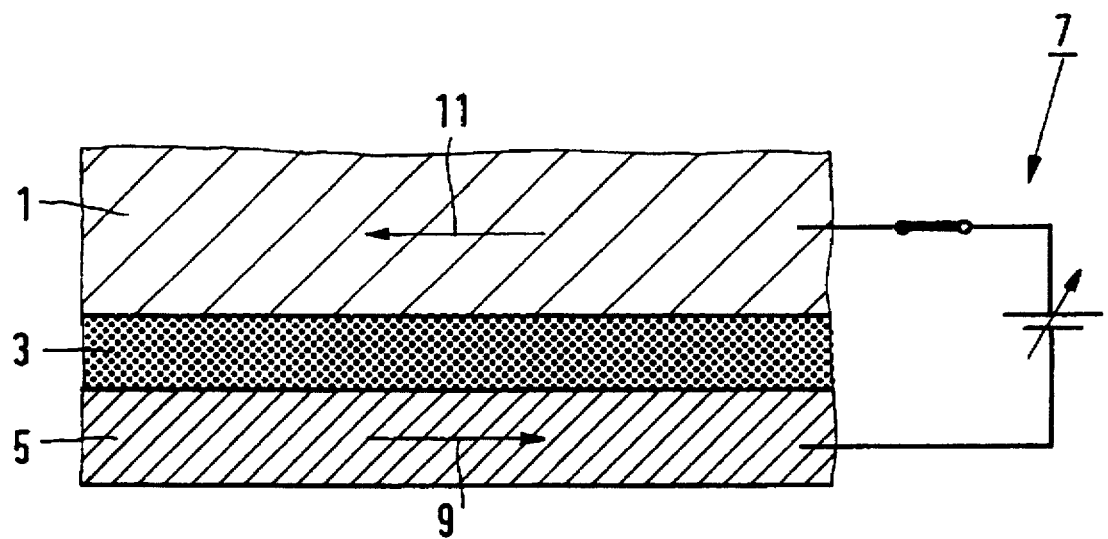
FIG. 2 shows the subject of FIG. 1 after enaction of the inventive method for controllably altering a magnetization direction.

FIGS. 1 and 2 cross-sectionally depict part of a device according to the present invention, which can be employed, for example, as a magnetic recording head. Corresponding parts of both figures are labelled using the same reference numerals.

In FIG. 1, a body 1 of magnetic material is magnetically coupled across a layer 3 of non-metallic material to a layer 5 of magnetic material. Bodies 1 and 5 comprise, for example, Fe; layer 3 comprises, for example, Si. The magnetization direction in layer 5 is fixed.

The bodies 1 and 5 are connected across controllable voltage supply means 7, which are here not yet invoked. The nature of the magnetic coupling across the interlayer 3 is, in this case, intrinsically ferromagnetic (as a result of pinhole formation, for example). As a result, the net magnetization vector 11 in body 1 is substantially parallel to the net magnetization vector 9 in layer 5.

In FIG. 2, the controllable voltage supply means 7 have been invoked to apply an electrical field across the layer 3. According to the invention, the presence of this electric field induces a certain degree of metallic character in the non-metallic material of layer 3. As a result, the magnetic coupling across the layer 3 becomes temporarily anti-ferromagnetic. Consequently, the magnetization vectors 9 and 11 adopt a substantially anti-parallel configuration. Since vector 9 is fixed, this entails the reversal of vector 11 with respect to its orientation in FIG. 1. The inventive method has therefore achieved controllable alteration of the magnetization direction in the body 1.

In the absence of strong coercivity, removal of the applied electrical field across the layer 3 will cause the magnetization vectors 9 and 11 to revert to the essentially parallel configuration depicted in FIG. 1.

As explained hereabove, a device such as this can be employed as a magnetic recording head.

Figure 3:
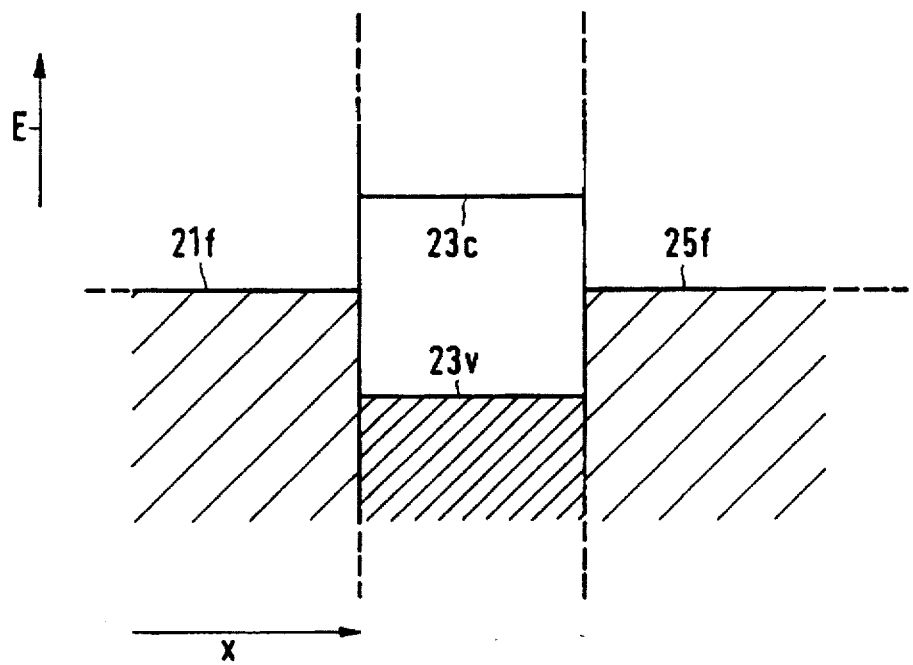
FIG. 3 is a schematic electronic band structure diagram pertaining to the situation in FIG. 1.
Figure 4:
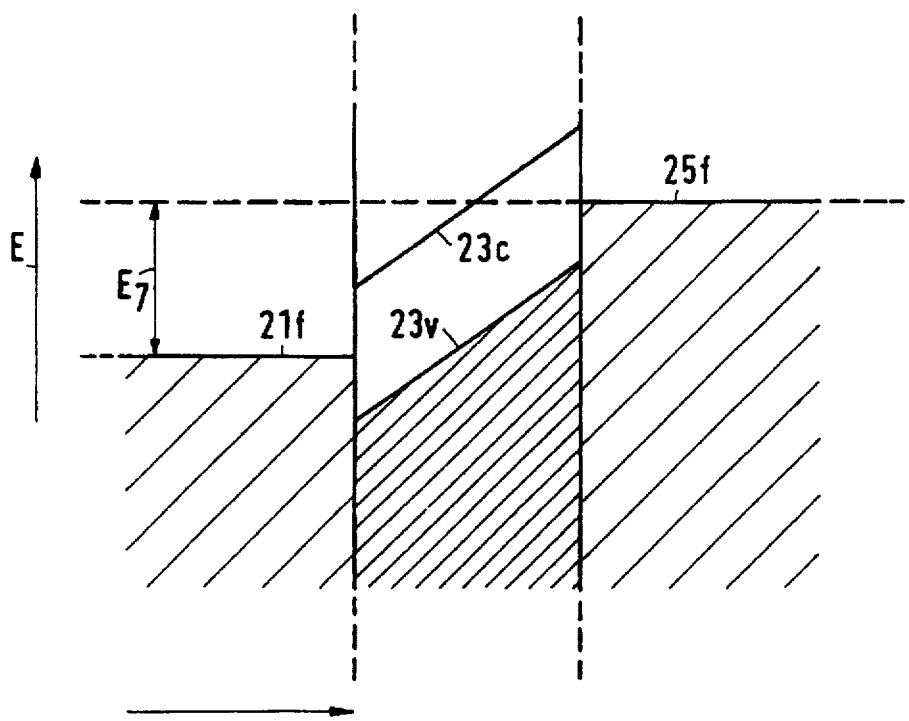
FIG. 4 is a schematic electronic band structure diagram pertaining to the situation in FIG. 2.

FIGS. 3 and 4 are highly simplified schematic electronic band structure diagrams pertaining, respectively, to the depicted scenarios in FIGS. 1 and 2. Both figures essentially render a graph of electronic potential energy E as a function of position x perpendicular to the plane of layer 3, in the vicinity of the interfaces between layer 3 and the bodies 1 and 5. Corresponding parts of both figures are labelled using the same reference symbols.

In FIG. 3, labels $21f$ and $25f$ respectively denote the Fermi levels of the metallic bodies 1 and 5 depicted in FIG. 1; by definition, all electronic states below these levels are filled. Labels $23v$ and $23c$ respectively denote the extremities of the valence band and the conduction band of non-metallic layer 3 in FIG. 1; by definition, all electronic states below level $23v$ (i.e. in the valence band) are filled, whereas essentially all those above level $23c$ (i.e. in the conduction band) are empty. Between levels $23v$ and $23c$ there is an energy gap (forbidden zone), which straddles the Fermi level.

Since the conduction band is essentially empty, layer 3 does not conduct electrically of its own accord. Electrons from levels $21f$ and $25f$ in the neighboring metals also cannot tunnel into the conduction band of layer 3, since level $23c$ is located above levels $21f$ and $25f$.

FIG. 4 shows the effect of applying an electric field across layer 3, as depicted in FIG. 2. Fermi level $25f$ is now raised with respect to Fermi level $21f$ by an amount $E_7$ (corresponding to the electrical potential delivered by the means 7). Consequently, the edges $23v$ and $23c$ in the non-metallic interlayer become canted (see, for example, the above-cited book by Sze, page 491). As a result of this canting, part of the conduction band in layer 3 falls below the new Fermi level $25f$, so that electrons can now successfully tunnel from layer 5 into the conduction band of layer 3. Such tunnelled electrons impart limited metallic character to the material of layer 3.

Figure 5:
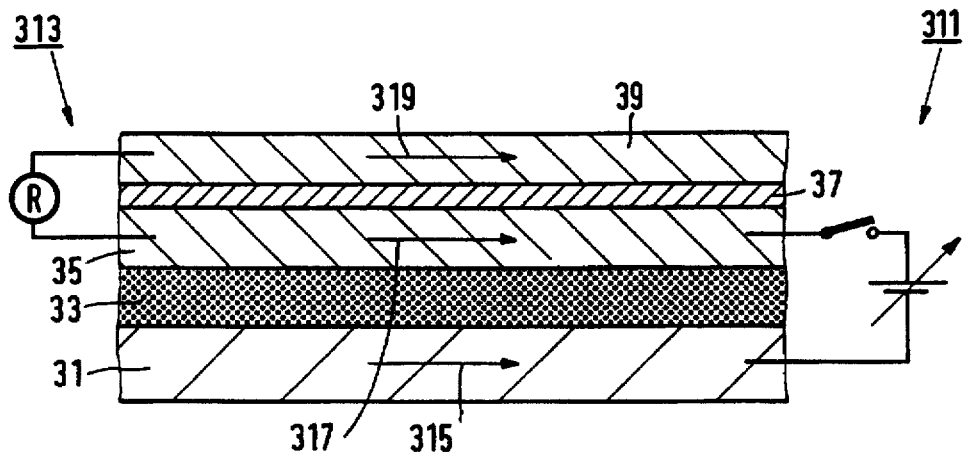
FIG. 5 gives a cross-sectional depiction of part of a device according to the invention, which device includes a spin-valve magneto-resistive multilayer structure.
Figure 6:
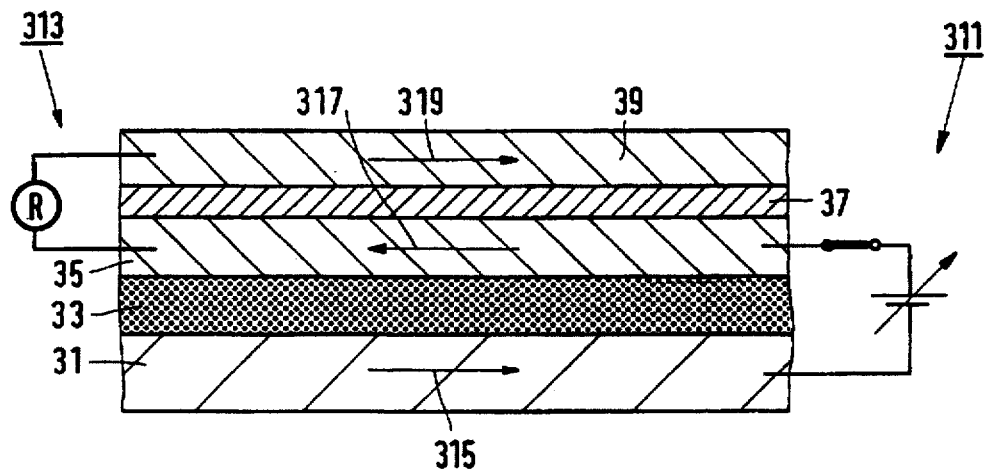
FIG. 6 shows the subject of FIG. 5 after enaction of the inventive method for controllably altering a magnetization direction.

FIGS. 5 and 6 cross-sectionally depict part of a device according to the present invention, which can be employed, for example, as a magnetic memory device. Corresponding parts of both figures are labelled using the same reference numerals.

In FIG. 5, a layer 31 of magnetic material is magnetically coupled across a layer 33 of non-metallic material to a layer 35 of magnetic material. The layer 35 is further magnetically coupled across a metallic layer 37 to a magnetic layer 39. The layers 35, 37 and 39 respectively comprise a Fe/Cr/Fe trilayer, which demonstrates a spin-valve magneto-resistance effect. The layer 31 comprises, for example, Fe; the layer 33 comprises, for example, Si. The magnetization direction in layer 31 is fixed. The magnetization direction in layer 39 is also fixed.

The layers 31 and 35 are connected across controllable voltage supply means 311, which are here not yet invoked. The nature of the magnetic coupling across the interlayer 33 is intrinsically ferromagnetic (for example, due to pinhole formation). As a result, the net magnetization vector 315 in layer 31 is substantially parallel to the net magnetization vector 317 in layer 35.

The layers 35 and 39 are connected across electrical resistance measuring means 313. The nature of the magneto-resistive effect in the trilayer 35/37/39 is such that the measured electrical resistance corresponding to a parallel configuration of the magnetization vectors 317 and 319 is lower than that corresponding to an anti-parallel configuration of magnetization vectors 317 and 319. As here symbolically depicted, the means 313 are embodied to measure the resistance perpendicular to the layers 35, 39 (so-called CPP geometry); it is, of course, also possible to measure the lateral electrical resistance across the trilayer structure, using the so-called CIP geometry.

In FIG. 6, the controllable voltage supply means 311 have been invoked to apply an electrical field across the layer 33. According to the invention, the presence of this electric field induces a certain degree of metallic character in the non-metallic material of layer 33. As a result, the magnetic coupling across the layer 33 becomes temporarily anti-ferromagnetic. Consequently, the magnetization vectors 315 and 317 adopt a substantially anti-parallel configuration. Since vector 315 is fixed, this entails the reversal of vector 317 with respect to its orientation in FIG. 5. The inventive method has therefore achieved controllable alteration of the magnetization direction in the layer 35.

When the applied electrical field across the layer 33 is removed, the magnetization vectors 315 and 317 revert to the essentially parallel configuration depicted in FIG. 5 (assuming relatively low magnetic coercivity).

By employing the means 313 to measure the electrical resistance of the trilayer structure 35/37/39, the magnetization configuration in the layers 31 and 35 can be deduced at any time.

As explained hereabove, a device such as this can be employed as a magnetic memory device.

Figure 7:
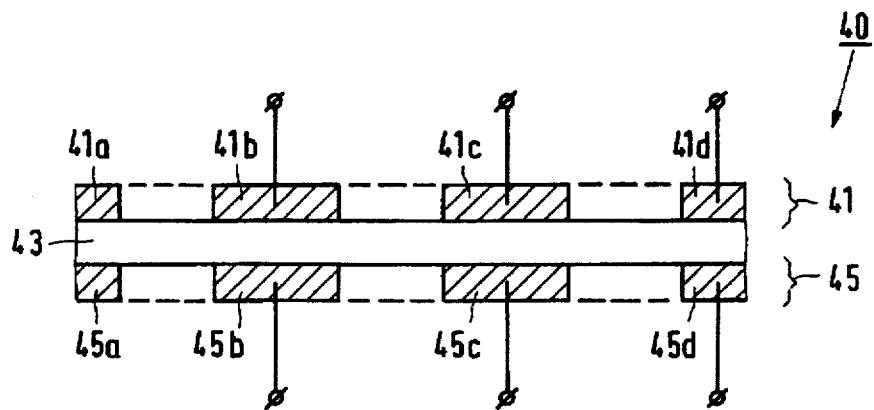
FIG. 7 cross-sectionally depicts part of a device according to the invention, in which device both magnetic bodies are embodied as an array of electrically isolated electrode segments.

FIG. 7 cross-sectionally depicts part of a device according to the invention. A first body 41 of magnetic material is magnetically coupled to a second body 45 of magnetic material across an intervening layer 43 of non-metallic material. Both bodies 41 and 45 comprise a multiplicity of isolated electrode segments, which are arranged in facing pairs (41a, 45a), (41b, 45b), (41c, 45c), (41d, 45d), etc. The various electrode segments can be individually electrified.

If, for example, electrode segments 41b and 45b are connected to the poles of a controllable DC voltage source, then the intervening portion of the layer 43 situated immediately between then can be subjected to an electric field. If the magnetization direction in segment 41b is fixed, then such subjection can be used according to the inventive method to alter the magnetization direction in segment 45b.

Such a device is suitable for use as a magnetic memory array.

We claim:

1. A method of controllably locally altering the magnetization direction in a body of magnetic material, characterized in that a layer of at least one of a non-metallic material and a semi-metallic material is disposed on a surface of the body, on which layer is provided a body of magnetic material having a fixed magnetization direction, whereby both bodies of magnetic material may be magnetically coupled across the interposed layer, the magnetic coupling being locally alterable by means for locally subjecting the layer to a variable electric field.

2. A method according to claim 1, characterized in that the layer comprises a semiconductor material.

3. A method according to claim 2, characterized in that the semiconductor material is Si.

4. A method according to claim 1, characterized in that the layer comprises a semi-metallic material.

5. A method according to claim 4, characterized in that the semi-metallic material is an FeSi compound.

6. A method according to claim 1, characterized in that the layer comprises an insulator material.

7. A method according to claim 6, characterized in that the insulator material is an oxide of Si.

8. A method according to claim 1, characterized in that the thickness of the layer does not exceed 10 nm.

9. A device suitable for use in a method according to claim 1, which device comprises at least two bodies of magnetic material which may be magnetically coupled across an interposed layer of at least one of a non-metallic material and a semi-metallic material, one of the magnetic bodies having a fixed magnetization direction, the device further comprising means for at least locally subjecting the layer to a controllable electric field so as to controllably locally alter the nature of the said magnetic coupling.

10. A device according to claim 9, characterized in that at least one of the bodies of magnetic material comprises non-oxidic metallic material.

11. A device according to claim 10, characterized in that the non-oxidic metallic material is Fe.

12. A device according to claim 9, characterized in that at least one of the bodies of magnetic material is a magnetic multilayer structure.

13. A device according to claim 12, characterized in that the magnetic multilayer structure demonstrates a spin-valve magneto-resistive effect.

14. A magnetic head comprising a device according to claim 9.

15. A method of controllably representing localized binary information in a device according to claim 9, whereby a first binary symbol is represented by locally invoking ferromagnetic coupling across the layer so as to locally induce substantially mutually parallel alignment of the magnetizations in the two magnetic bodies, whereas a second binary symbol is represented by locally invoking antiferromagnetic coupling across the layer so as to locally induce substantially mutually anti-parallel alignment of the magnetizations in the two magnetic bodies.

16. A method according to claim 1, characterized in that the layer comprises a non-metallic material.

* * * * *